United States Patent
Pascucci

(10) Patent No.: US 6,549,485 B2
(45) Date of Patent: Apr. 15, 2003

(54) CONTROL AND TIMING STRUCTURE FOR A MEMORY

(75) Inventor: Luigi Pascucci, Sesto San Giovanni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/972,753

(22) Filed: Oct. 5, 2001

(65) Prior Publication Data

US 2002/0067655 A1 Jun. 6, 2002

(30) Foreign Application Priority Data

Oct. 6, 2000 (IT) ......................................... MI00A2163

(51) Int. Cl.$^7$ ................................................. G11C 8/00
(52) U.S. Cl. ................ 365/233; 365/230.04; 365/238.5
(58) Field of Search .............................. 365/233, 233.5, 365/238.5, 230.03, 230.04

(56) References Cited

U.S. PATENT DOCUMENTS 5,261,064 A * 11/1993 Wyland ....................... 395/400
5,568,427 A * 10/1996 Takemae ............... 365/230.03

* cited by examiner

*Primary Examiner*—Son Mai
(74) *Attorney, Agent, or Firm*—Lisa K. Jorgenson; E. Russell Tarleton; Seed IP Law Group PLLC

(57) ABSTRACT

A timing and control structure for a memory, including the timing and control structure includes a first circuit that can recognize, on the basis of control signals supplied to the memory from the exterior, whether a random-access reading is to be executed, the control signals including a first control signal indicative of the presence of an address supplied to the memory from the exterior, and a second control signal that, upon switching edges of a first type, supplies to the control and timing structure a time base for the execution of the random-access readings and, upon switching edges of a second type, supplies a time base for the execution of the sequential readings, a second circuit controlled by the first circuit and upon a random-access reading, generates a first synchronism signal in response to a transition of the first type in the second control signal, a third circuit sensitive to transitions of the second type in the second control signal and which can generate a second synchronism signal upon transitions of the second type, and a fourth circuit controlled by the first circuit to supply a stimulus signal to a timing circuit of the memory, the stimulus signal corresponding to the first synchronism signal for a random-access reading, or to the second synchronism signal for a sequential reading.

27 Claims, 5 Drawing Sheets

CONTROL AND TIMING STRUCTURE FOR A MEMORY

BACKGROUND OF THE INVENTION

1. Field of the Invention

Figure 1:
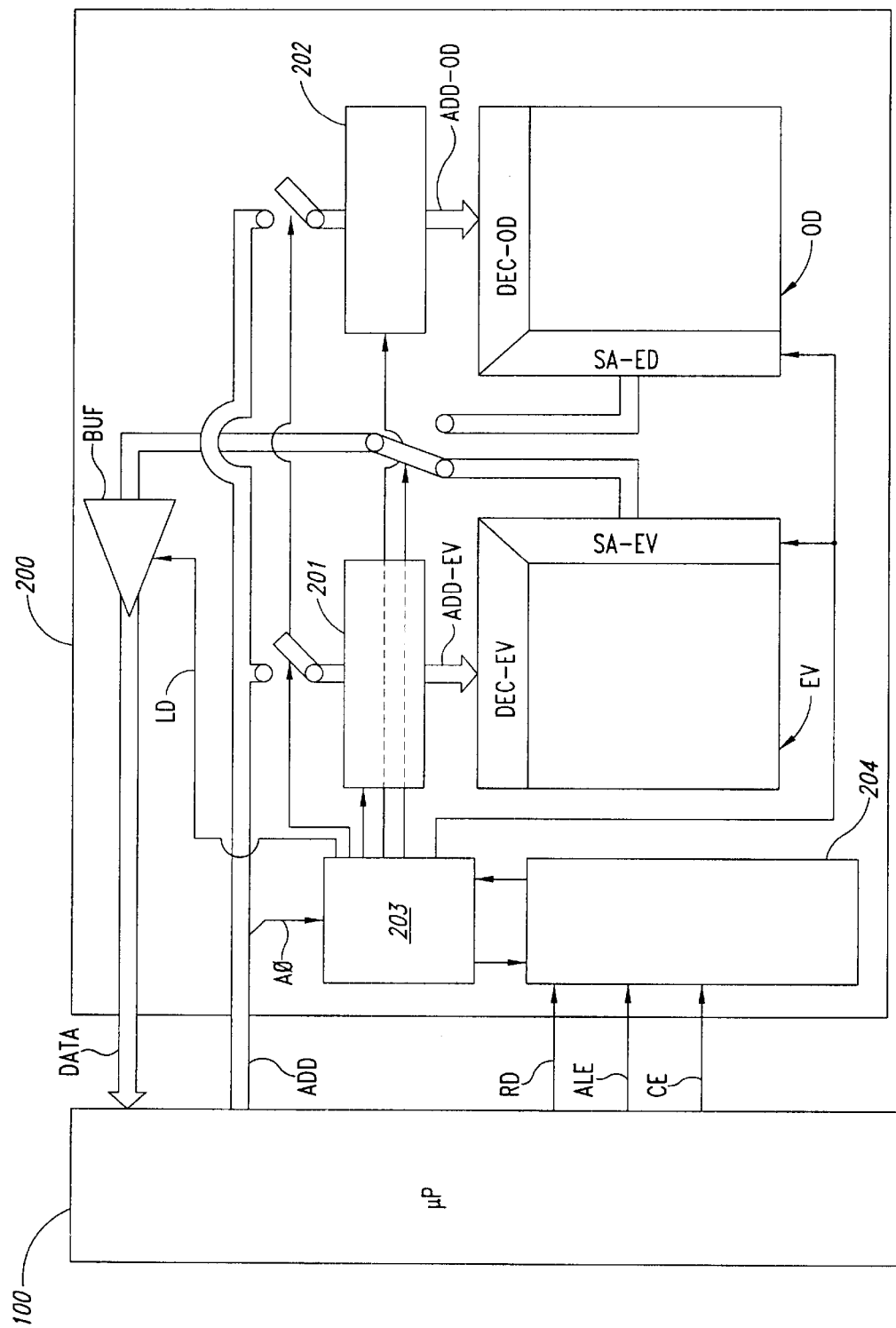

The present invention relates to the field of semiconductor memories and, in particular but not exclusively, to non-volatile semiconductor memories such as, for example, ROMs, EPROMs, EEPROMs and Flash memories.

More specifically, the subject of the invention is a control and timing structure for a semiconductor memory, that is, a structure which is integrated in the memory and which can control the progress of operations inside the memory and can dictate their timing. Even more specifically, the subject of the invention is a control and timing structure for a memory with a functional capability for sequential or "burst" reading, particularly performed by sequential and interleaved accesses to memory locations belonging to distinct memory banks.

2. Description of the Related Art

The typical structure of the simplest non-volatile semiconductor memories such as ROMs and EPROMs comprises basically a matrix of memory cells (the memory matrix) in which the cells are arranged in rows ("word lines") and columns ("bit lines"), circuits for decoding an address supplied to the memory from the exterior, circuits for selecting the memory cells within the matrix in dependence on the address supplied from the exterior, circuits for reading the contents of the memory cells selected, and output circuits for driving external data lines.

In a conventional non-volatile memory, the sole type of reading access to the memory is random access. The address of the memory location the content of which is to be read is supplied to the memory from the exterior. The decoding circuits and the selection circuits, respectively, decode the address supplied from the exterior and select the memory cells which correspond to that address, that is, they select the rows and the columns. The reading circuits read the contents of the memory cells selected and supply the result of the reading to the output circuits; the datum read in the memory location addressed is placed on the data lines outside the memory.

During random access to the memory, the time required to perform the reading (the memory-access time) is the sum of individual times representative of the durations of the various individual steps which make up the access and datum-extraction process. Basically, these individual steps are: the propagation of the signals along the row and column selection paths, precharging operations, for example, of the columns selected, the step of reading and evaluating the data stored in the memory cells selected, the propagation and transfer of the data read to the output ("buffer") circuits, and the switching thereof.

Each random-access operation involves the execution of all of the above-mentioned individual steps. Precisely for this reason, the access time is quite long or, in any case, is difficult to reduce, even with the use of advanced manufacturing technologies. In particular, the memory-access time for a random reading is longer than the time which is strictly necessary to perform the reading of the content of a memory location.

However, whilst having an access time which is not optimal, the conventional architecture has the advantage that it is straightforward in terms of internal circuit structures and simple from the point of view of the timing (the memory behaves asynchronously), that it can be used relatively easily for the implementation of redundancy structures for "functionally repairing" memory elements which are not operating, and that it has low consumption.

Italian patent application MI2000A002165 entitled "A semiconductor memory architecture", filed by the Applicant on Oct. 6, 2000 describes an architecture for a semiconductor memory which can implement an interleaved sequential reading method on a pair of memory banks in a memory. The contents of this patent application are incorporated herein in its entirety.

The memory architecture which is the subject of the above-mentioned Italian patent application provides for two memory banks containing even memory address locations and odd memory address locations, respectively. Each memory bank has its own circuits for selecting the locations and its own circuits for reading the contents of the locations. An address structure is also provided within the memory and enables the memory to perform a reading of successive locations in sequence by accessing one and the other of the two memory banks alternately, starting from an origin memory location the address of which is supplied to the memory from outside.

BRIEF SUMMARY OF THE INVENTION

In view of the foregoing, the disclosed embodiments of the present invention provide a control and timing structure for a memory, in particular a memory having an architecture of the above-mentioned type.

According to the embodiments of the present invention, this is achieved by means of a timing and control structure for a memory that includes a pair of memory banks each of which is associated with respective circuits for selecting the memory locations of the memory bank and respective circuits for reading the contents of the locations selected, and an internal addressing structure that can execute random-access readings by accessing locations corresponding to addresses supplied to the memory from the exterior, and sequential readings by accessing, in sequence, starting from an origin memory location the address of which is supplied to the memory from outside, memory locations succeeding the origin location and belonging to one and to the other of the memory banks, alternately, and further including:

first circuit means which can recognize, on the basis of control signals supplied to the memory from the exterior, whether a random-access reading is to be executed, the control signals comprising a first control signal indicative of the presence of an address supplied to the memory from the exterior and a second control signal which, upon switching edges of a first type ("1"->"0"), supplies to the control and timing structure a time base for the execution of the random-access readings and, upon switching edges of a second type ("0"->"1"), supplies a time base for the execution of the sequential readings, second circuit means which are controlled by the first circuit means and which, for a random-access reading, generate a first synchronism signal in response to a transition of the first type ("1"->"0") in the second control signal, third circuit means which are sensitive to transitions of the second type ("0"->"1) in the second control signal and which can generate a second synchronism signal upon transitions of the second type, and fourth circuit means which are controlled by the first circuit means and which supply a stimulus signal to a timing circuit of the memory, the stimulus signal corresponding to the first synchronism signal for a random-access reading, or to the second synchronism signal for a sequential reading.

BRIEF DESCRIPTION OF THE SEVERAL VIEWS OF THE DRAWING(S)

Figure 2:
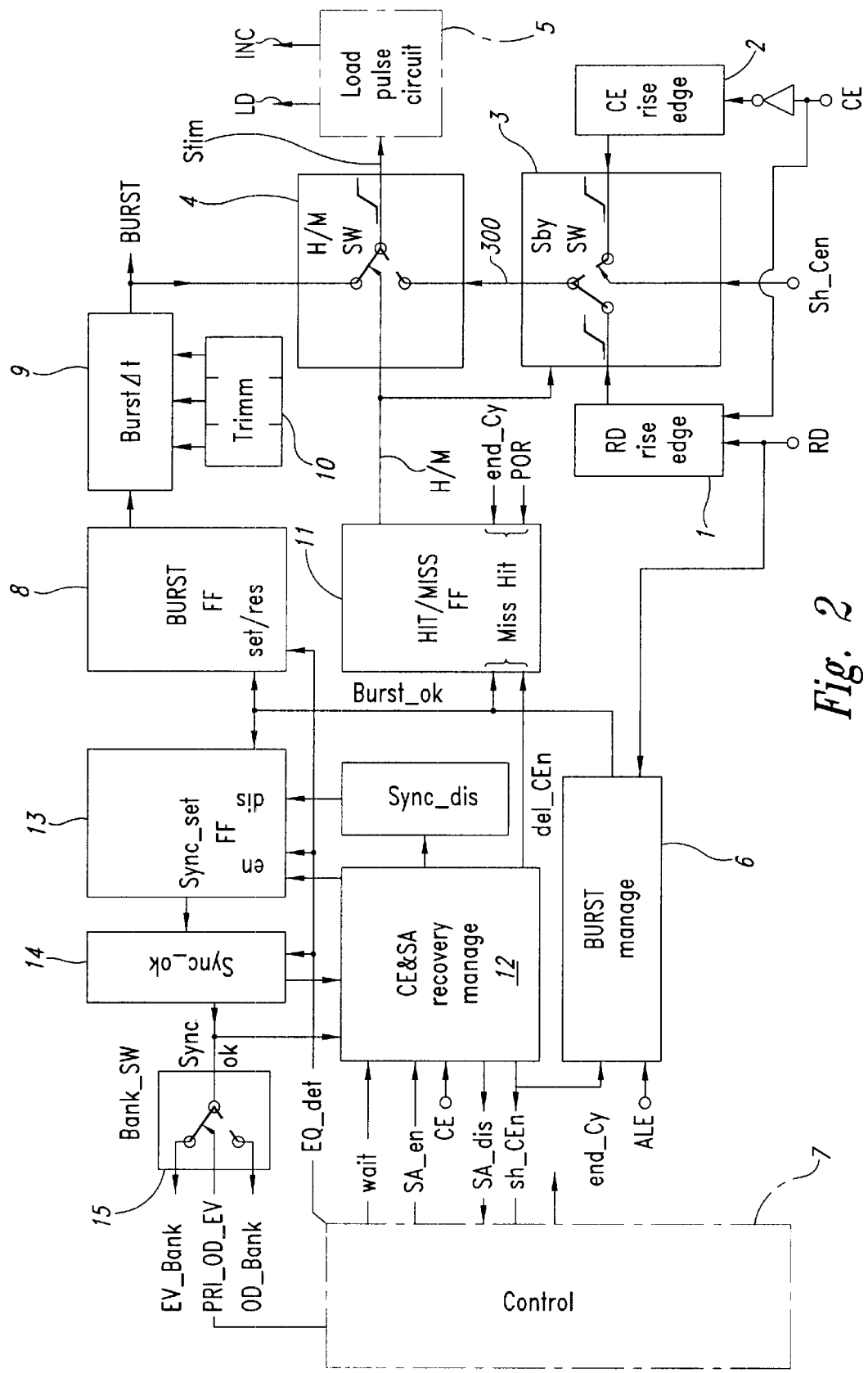
Figure 5:
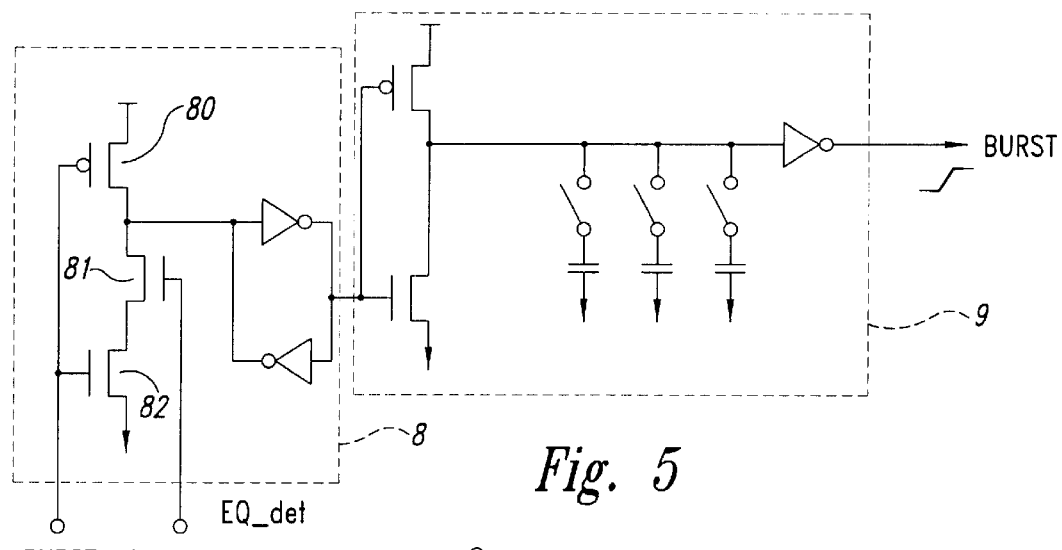
Figure 6:
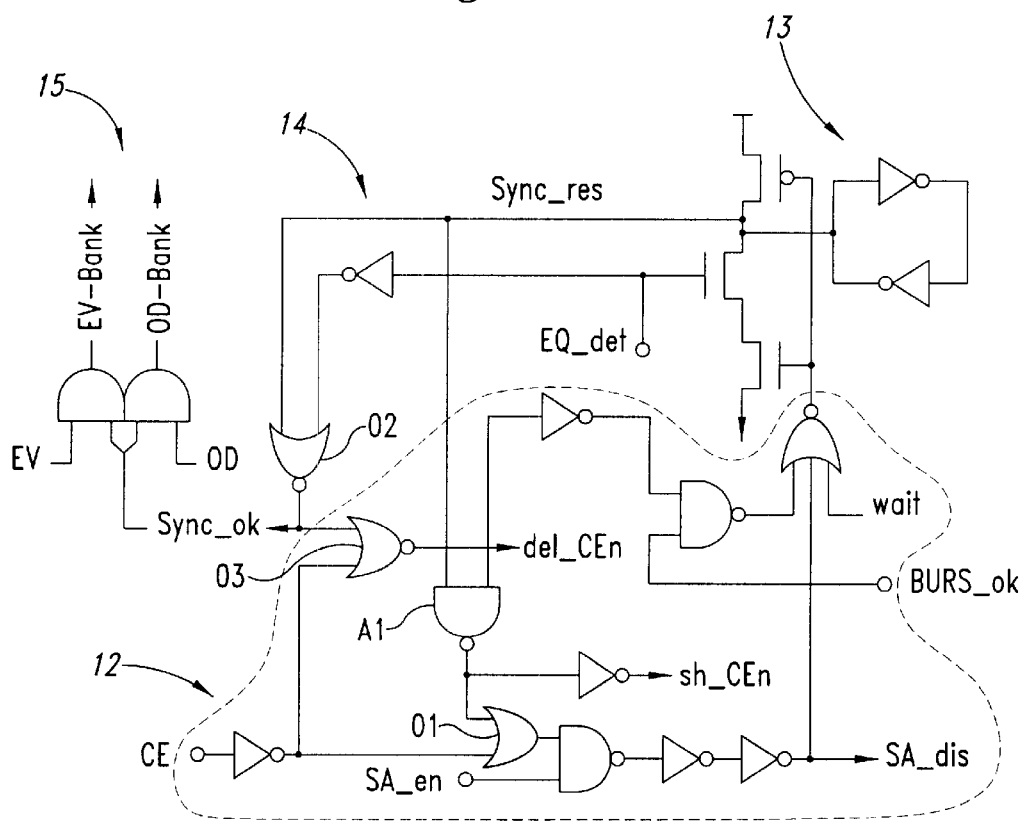
Figure 7:
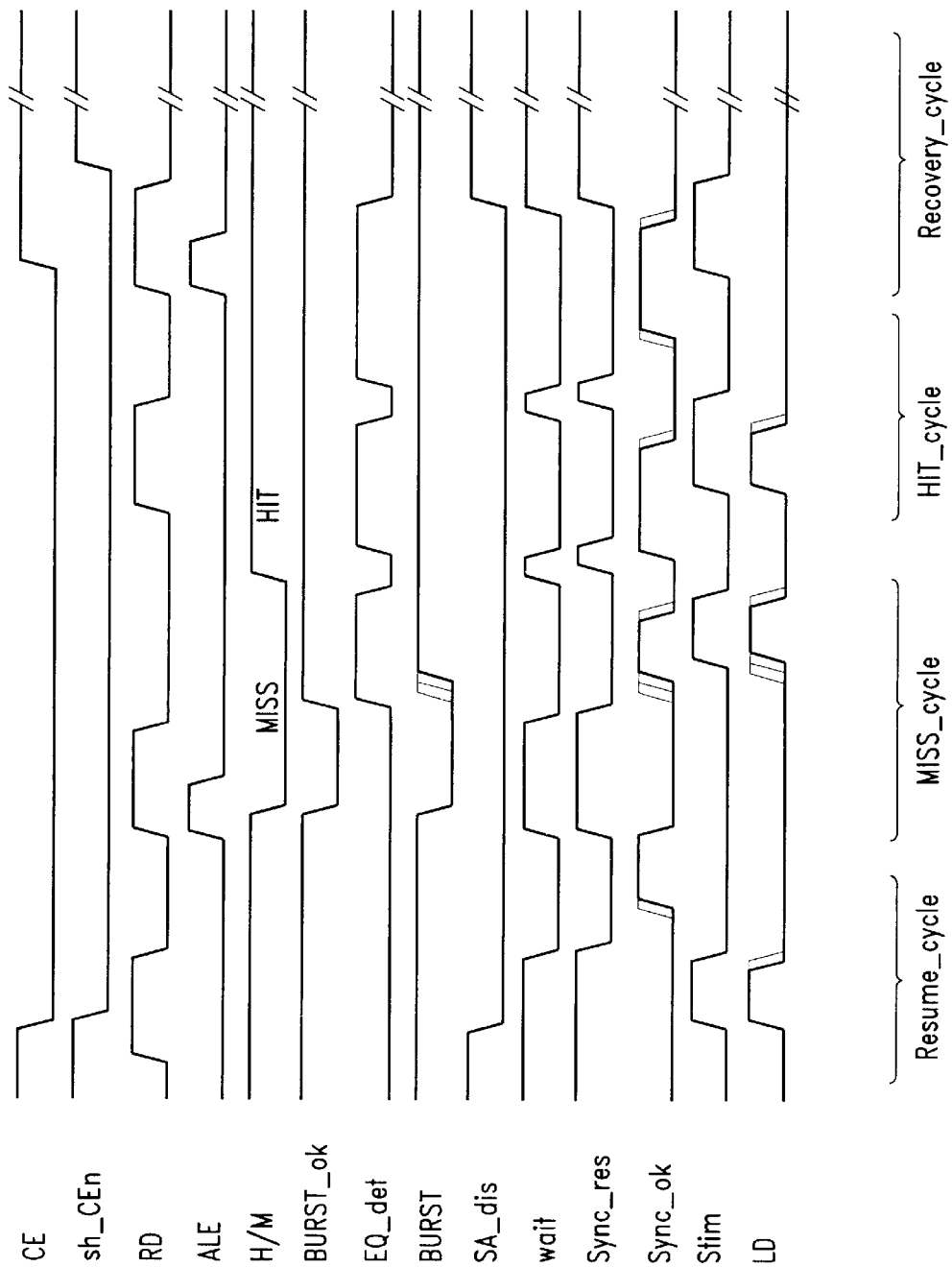

The characteristics and the advantages of the embodiments of the present invention will become clear from the following detailed description of a possible practical embodiment thereof, which is illustrated purely by way of non-limiting example in the appended drawings, in which:

FIG. 1 shows, at the level of a greatly simplified block diagram, an electronic system comprising a microprocessor and a memory including a control and timing structure according to the present invention, FIG. 2 shows, in terms of functional blocks, the control and timing structure of the memory of FIG. 1, FIGS. 3 to 6 show possible practical embodiments of the functional blocks of FIG. 2 in detail, and FIG. 7 is a graph showing the development, over time, of the most significant signals for the control and timing of the memory.

DETAILED DESCRIPTION OF THE INVENTION

With reference to the drawings, FIG. 1 shows, very schematically, an electronic system comprising a microprocessor 100 operatively connected to a memory 200 incorporating a timing and control structure according to the present invention.

The memory has a structure substantially of the type described in the above-mentioned Italian patent application entitled "A semiconductor memory architecture", the content of which is incorporated in the present description. The memory 200 comprises two memory banks EV, OD. The bank EV contains the memory locations having even addresses, and the bank OD contains the memory locations having odd addresses. The address of a memory location means the address which the microprocessor has to supply to the memory in order to access the location. The even addresses are all of those addresses in which the least significant bit is a logic "0", whereas the odd address are all of the addresses in which the least significant bit is a logic "1".

Each memory bank has its own circuits DEC_EV, DEC_OD for selecting the locations of the memory bank and its own circuits SA_EV, SA_OD for reading the contents of the locations selected.

The memory comprises an internal structure for addressing of the memory locations of the two banks. This addressing structure comprises, for each memory bank, a respective scanning circuit 201, 202, basically a counter, which supplies to the selection circuits DEC_EV, DEC_OD of the respective memory bank address signals ADD_EV, ADD_OD for the addressing and the selection of the locations of the memory bank EV, OD. The addressing structure also comprises a series of control circuits which are shown schematically as a single block 203 and which govern the operation of the scanning circuits 201, 202. The scanning circuits 201, 202 can load an address supplied to the memory from the exterior by means of a bus ADD, in which case the memory will perform a random-access reading (random reading); the memory bank is selected by the circuits 203 on the basis of the state of the bit A0 of the address supplied to the memory, which is the least significant bit of the address that discriminates the even addresses (A0="0") from the odd addresses (A0="1").

Starting from an origin location the address of which is supplied to the memory by the microprocessor, the addressing structure can also perform a reading in sequence of the memory locations which succeed the origin location in the address space, on the basis of an interleaved method according to which one and the other of the two memory banks EV, OD is accessed alternately. In this case, the circuits 203 govern the scanning circuits 201, 202, bringing about increments thereof in appropriate manner, control the reading circuits of the memory banks, and also manage the selective connection of the outputs of the reading circuits SA_EV, SA_OD of the two banks to driver circuits BUF (output buffers) of a data-line bus (DATA).

According to the present invention, the memory comprises an internal control and timing structure comprising a plurality of circuits which are shown schematically as a single block 204 in FIG. 1. The control and timing structure 204 receives control signals RD, ALE, and CE, from the microprocessor. The significance of these signals will become clearer from the following description. For the moment it will suffice to say that the signal CE ("Chip Enable") is a signal for the selection/deselection of the memory; typically a low logic level ("0") on this signal selects the memory, enabling it, whereas a high logic level ("1") deselects the memory, disabling it and putting it in the "standby" condition; the signal RD ("ReaD") is a signal by means of which the microprocessor controls and times the reading operations; the signal ALE ("Address Latch Enable") is a signal which informs the memory that the microprocessor has put on the address bus ADD a new address of a location the content of which is to be read.

The control and timing structure 204 interacts with the circuit 203, supplying control signals thereto.

FIG. 2 shows the internal control and timing structure of the memory in terms of functional blocks. The structure comprises first of all:

a circuit block 1 ("RD rising edge"), which can detect a rising switching edge ("0"->"1") of the external signal RD, a circuit block 2 ("CE rising edge"), which can detect a rising switching edge ("0"->"1") of a signal which is the logic complement of the external signal CE (the block 2 can thus detect a "1"->"0" switching edge of the signal CE), a circuit block 3 ("Sby SW"), which is basically a switch controlled by a signal sh_CEn (indicative of a "standby" condition of the memory, as will be described further below) and which receives output signals from the two blocks 1 and 2; when the memory is not in standby condition, the switch 3 is switched to the output of the block 1, whereas in standby conditions, the switch is switched to the output of the block 2, a circuit block 4 ("H/M SW") which is also basically a switch which receives a signal output by the block 3; the switch 4 has an output Stim which it can switch between the output of the block 3 and a signal BURST, generated by further circuit blocks which will be described below.

The switch 4 is controlled by a signal H/M which is indicative of a random-access reading condition with an address supplied to the memory from the exterior (a "MISS" reading cycle) or, conversely, a sequential reading condition (a "HIT" reading cycle). The signal H/M is generated by a circuit block 11 ("HIT/MISS FF") which will be described below.

The signal Stim is supplied to a circuit block 5 ("Load pulse circuit"). The circuit block 5 forms part of the circuits which are outlined schematically by the block 203 in FIG. 1. In particular, the block 5 can generate timing signals for the various circuit blocks of the memory which are involved in the execution of a reading operation. The block 5, which is sensitive to the rising edge of the signal Stim, generates, amongst other things, a pair of signals LD and INC; both of these signals are pulsed signals. The signal LD, which controls the output buffers BUF, causes the datum read in a memory location addressed to be made available on the data bus DATA outside the memory. The signal INC, on the other hand, updates the internal addressing structure of the memory so as to arrange the addressing structure pointing to the succeeding memory location in the correct memory bank so as to implement the interleaved method of access to locations belonging to one and to the other of the two memory banks EV, OD, alternately.

Figure 3:
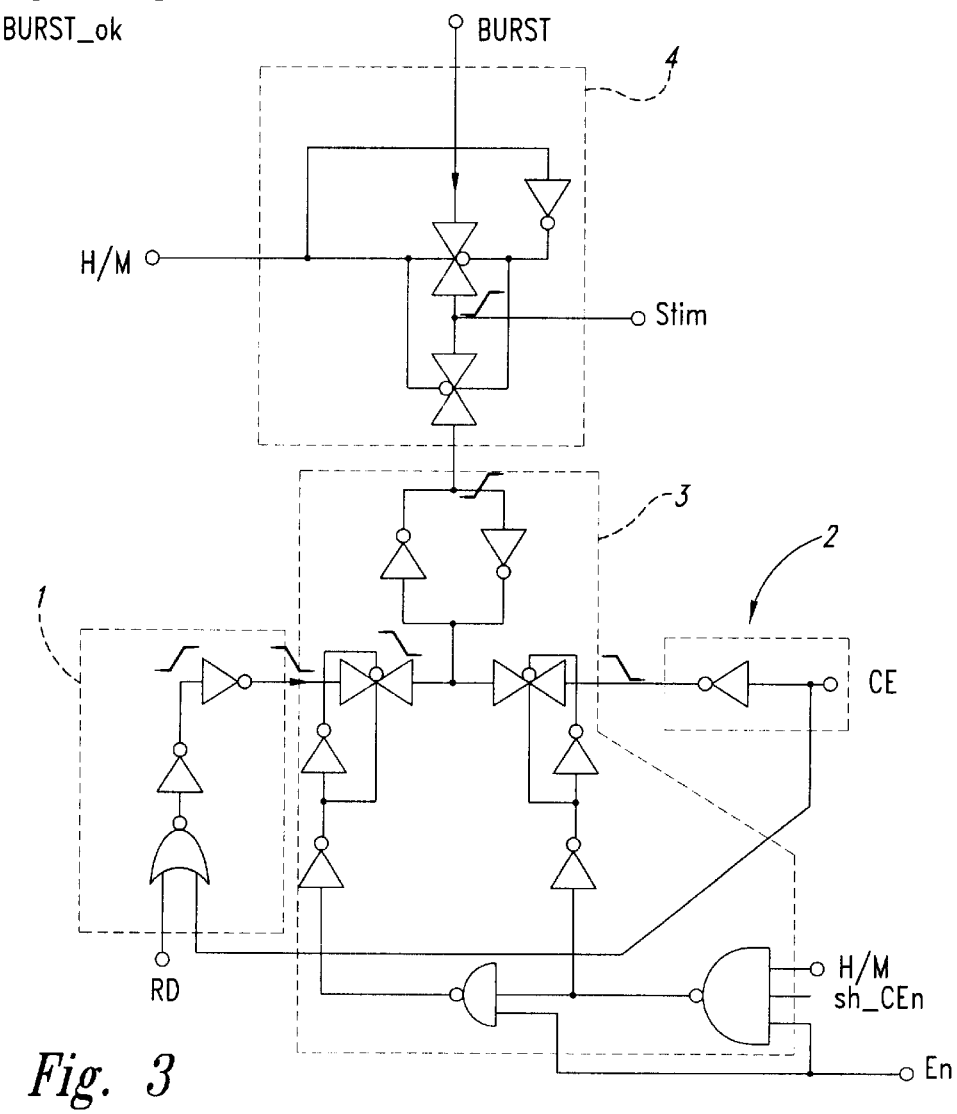

FIG. 3 shows a possible circuit embodiment of the blocks 1, 2, 3 and 4 of FIG. 2. It can be seen that the block 1, which comprises basically a NOR gate that receives the signal RD and the signal CE as inputs, is affected by the signal CE in a manner such that, when the signal CE is at "1" (memory in standby), the block 1 becomes insensitive to the signal RD (the output of the block 1 is in this case forced to "0"). It will also be noted that the block 3 comprises a flip-flop, which is necessary since the transfer gates which permit the selective transfer of the signal RD or of the signal CE may be disabled simultaneously when a noise situation (signal En="0") is detected, so as to filter spurious transitions of the signal Stim.

Figure 4:
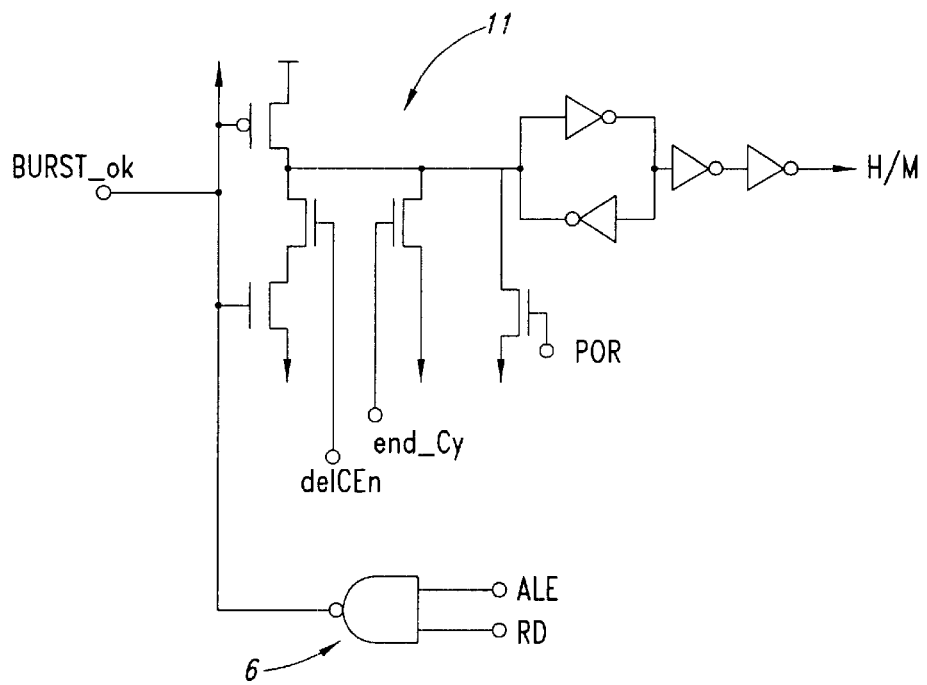

With further reference to FIG. 2, the generation of the signal BURST is entrusted to a plurality of circuit blocks which will now be described and a possible practical embodiment of which is shown in FIGS. 4 and 5.

A block 6 ("BURST" manage") receives the signal RD and the signal ALE. As mentioned above, the signal ALE is activated by the microprocessor to which the memory is subservient after the microprocessor has placed on the address bus ADD outside the memory a new address of a memory location the content of which is to be read.

If the block 6 detects the simultaneous activation of the signal RD and of the signal ALE, a signal BURST_ok is forced to low logic level ("0"). This puts the memory in the "MISS" condition which corresponds to a random-access reading cycle with the address of the memory location to be read supplied to the memory from the exterior. The signal BURST_ok is supplied to a circuit block 8 ("BURST FF"). The block 8 comprises a bistable circuit (a flip-flop) of the "set/reset" type which is reset by the signal BURST_ok when this signal is brought to logic level "0" (switching on the p-channel MOSFET 80), and which is set when the signal BURST_ok and a signal EQ_det are brought to logic level "1" (thus switching on the series of two n-channel MOSFETs 81, 82). The signal EQ_det is supplied by a circuit block 7 which comprises circuits forming part of the circuit block schematically indicated 203 in FIG. 1. The signal EQ_det switches so as to be brought to "1" when the step of the actual evaluation of the datum to be read starts in the currently selected memory bank. The evaluation step means the step which starts after the steps of the selection of the word lines, the precharging of the bit lines, and the equalization of the reading circuits SA_EV, SA_OD.

The output of the flip-flop of the block 8 is supplied to a circuit block 9, the output of which constitutes the signal BURST. The circuit block 9 comprises a delay line which introduces a delay Δt between the rising edge of the output signal of the block 8 and the consequent rising edge of the signal BURST. The delay introduced by the delay line of the circuit block 9 is adjustable by means of an adjustment block 10 ("Trim").

The signal BURST_ok is also supplied to the block 11 ("HIT/MISS FF"). The block 11 also receives a signal end_Cy, a signal POR, and a signal del_CEn. The signal POR is a power-on resetting signal generated by a power-on resetting circuit ("Power On Reset"). This power-on resetting circuit, which is not shown since it is of known type, detects the presence of a voltage on a supply line of the memory and consequently activates the signal POR in order to reset correctly the various circuit blocks which make up the memory. The signal end_Cy is a signal indicative of the completion of a reading cycle by the memory, either for a sequential reading cycle (a HIT cycle) or for a random-access reading cycle (a MISS cycle). The signal end_Cy is activated after the datum read from the memory location addressed has been put on the data bus outside the memory for reading by the microprocessor, and after the internal addressing structure of the memory has been updated. The signal del_CEn is a signal within the memory and is activated when the memory is deselected (that is, when the external signal CE for the selection/deselection of the memory is deactivated). The signal del_CEn is suitably delayed relative to the signal CE to allow the memory to perform recovery operations when it is put in standby, as will be explained further below.

If the signal RD is activated (logic level "1"), the activation of the signal ALE by the microprocessor starts a random-access reading cycle (a MISS cycle) and the address of the memory location on which the reading is to be performed is supplied to the memory from the exterior. In particular, this causes the signal BURST_ok to be forced to "0" by the block 6. As stated, this brings about resetting of the flip-flop of the block 8 and of the flip-flop of the block 11. The flip-flop of the block 11 is put in a condition such that the signal H/M which is generated by the block 11 is brought to "0" and causes the switch 4 to be switched to the signal BURST. At the end of the signal ALE, that is, when this signal has been returned to "0" by the microprocessor, the block 6 brings the signal BURST_ok to "1". After the activation of the signal BURST_ok, the activation of the signal EQ_det brings about setting of the flip-flop 8 and thus, with a suitable delay introduced by the delay line 9, generates a rising edge in the signal BURST. This rising edge is translated into a rising edge of the signal Stim which thus causes the block 5 to produce the signals LD and INC.

Upon completion of the reading cycle, after the datum has been read from the memory location addressed by the address supplied from the exterior, and after the internal addressing structure of the memory has been updated, the block 7 activates the signal end_Cy. The activation of the signal end_Cy brings about setting of the flip-flop 11 in the condition such that the signal H/M is brought to "1" and switches the switch 4 to the output of the block 3. The memory is thus arranged automatically for a sequential reading. If the microprocessor does not put in a new address and the signal ALE is therefore not turned on, the signal Stim will be supplied by the block 3. Since the block 3 is not the memory in standby, it is switched to the output of the block 1, that is, the memory becomes sensitive to rising edges of the signal RD. Upon each new rising edge of the signal RD brought about directly by the microprocessor, a corresponding rising edge is thus produced in the signal Stim and the timing of the various steps which make up a reading operation by the memory is thus controlled by the rising edge of the signal RD.

The memory remains in this condition, that is, the flip-flop of the block 11 remains set in this position until the microprocessor puts an address on the address bus and turns on the signal ALE. If this occurs, the signal BURST_ok is brought to "0" again which brings about resetting of the flip-flop 8 in the "MISS" condition with the signal H/M switching the switch 4 to the signal BURST.

Upon the switching-on of the memory, when the appropriate supply voltage is supplied, on the other hand, the activation of the signal POR causes the flip-flop 11 to be set in the "HIT" condition with the signal H/M in a state such as to switch the switch 4 to the output of the block 3.

When the memory is in standby condition (signal sh_CEn activated), the switch 3 is switched to the output of the block 2. The memory is thus sensitive to the rising edge of the signal CE, rather than to that of the signal RD. The "0"->"1" transition of the signal CE, which is equivalent to the re-enablement of the memory, thus produces a rising edge in the signal Stim. Upon re-entry from the standby condition, the memory thus starts a reading.

With further reference to FIG. 6, the timing and control structure according to the invention also comprises a block 13 ("Sync_set FF"), comprising a bistable circuit (a flip-flop) which is reset each time the signal BURST_ok is brought to "0"; since, as described above, the signal BURST_ok is brought to "0" only when the external signals ALE and RD are both at "1", the flip-flop 13 is reset upon each initial cycle of a sequential reading, that is, when the microprocessor continues to supply addresses from outside the memory (in which case the signal ALE is kept constantly at "1"). The flip-flop 13 has an output Sync_res which adopts the value "1" when the signal BURST_ok adopts the value "0". The signal Sync_res also adopts the value "1" when a signal SA_dis is brought to "1", or when a signal WAIT adopts the value "1". The significance of the two signals SA_dis and WAIT will be explained further below.

The output Sync_res of the block 13 is supplied to a block 14 ("Sync_ok") which also receives the signal EQ_det already mentioned above (the signal indicative of the starting of the datum-evaluation step by the reading circuits).

The signal Sync_ok controls a block 15 ("Bank_SW"), basically a switch, which controls the connection of the outputs of the reading circuits SA_EV, SA_OD of the two memory banks EV, OD to the output buffers BUF. If the signal Sync_res adopts the value "1", neither of the two memory banks can be connected to the output buffers of the memory; these buffers therefore remain isolated. The changing of the signal Sync_res to "1" causes the signal Sync_ok to change to "0", which puts a switch 15 in high-impedance conditions. When, on the other hand, the signal Sync_ok is at "1", the outputs of the reading circuits of one or of the other of the two memory banks can be connected, mutually exclusively, to the output buffers BUF. Since the signal Sync_res is set at "0" upon the arrival of the signal EQ_det (which is indicative of the fact that the evaluation step is in progress), the structure brings about, without delays or losses of time, a synchronization between a request for a new datum (a "0"->"1" transition of the signal RD) and the connection of the outputs of the reading circuits of one or of the other of the two reading banks to the output buffers.

The flip-flop 13 is reset when the signal BURST_ok is brought to "1", or when the signal SA_dis is brought to "0" (that is, when the memory is performing a reading), or also when the signal WAIT is brought to "0". In any case, the flip-flop 13 is not reset until the signal EQ_det is activated.

After the flip-flop 13 has been reset, that is, after the signal Sync-res has been brought to "0", the signal Sync_ok is brought to "1". This makes it possible to select the memory bank from which to take the datum to be transferred to the output buffers; this selection is performed by signals PRI_OD/EV, generated by the internal addressing structure of the memory. The outputs of the reading circuits of the memory bank selected are thus connected to the output buffers.

At the end of each reading cycle (after the datum read has been made available on the data bus outside the memory for reading by the microprocessor), the output buffers are always isolated from the reading circuits of the two memory banks. For this purpose, the control unit activates the signal WAIT which sets the flip-flop 13 and causes the signal Sync_res to change to "1".

The signal WAIT is brought back to "0" only when the external signal RD is brought back to "0". As long as the signal RD remains at "1", the signal WAIT is kept active and prevents updating either of the output buffers or of the internal addressing structure of the memory. The signal WAIT thus freezes the activities of the memory and enables it to be synchronized with the microprocessor since the restarting of activities by the memory is conditional upon the signal RD, which is controlled by the microprocessor itself. This feature enables the adherence of the controls to the interleaved protocol to be checked.

The timing structure according to the invention also comprises a circuit block 12 ("CE&SA recovery manage"). This circuit block comprises circuits which can cause the memory to execute a procedure for going into standby in response to the external memory-disablement signal CE. In general, the circuit block 12 arranges for the memory not to go into the standby condition immediately when the microprocessor brings about disablement of the memory by means of the signal CE, but to go into this condition only after it has performed some operations which will now be described further.

If a reading operation is in progress at the moment at which the microprocessor brings about disablement of the memory by means of the signal CE, the memory awaits the end of the reading cycle which is in progress. The indication of the end of the reading cycle is supplied, as described above, by the turning-on of the signal WAIT (that is, by the "0"->"1" transition of the signal WAIT).

As long as the signal WAIT remains at "0", the memory-disablement command coming from the microprocessor by means of the signal CE has no effect.

With reference to FIG. 6, since the signal Sync_res is at "0", the output of the NAND gate A1 is forced to remain at "1". The change to "1" of the signal CE, which is an external signal controlled by the microprocessor and which, when brought to "1", brings about disablement of the memory, thus has no effect on the signal SA_dis, since the OR gate O1 has its input connected to the output of the NAND gate A1 at logic level "1".

The signal CE initially also has no effect on the signal del_CEn. In fact, after the activation ("1") of the signal EQ_det, as long as the signal WAIT remains at "0", the signal Sync_res is at "0" and the signal Sync_ok (output of the NOR gate O2) is therefore at "1". This means that the signal del_CEn, output by a NOR gate O3 which receives as inputs the signal Sync_ok and the logic complement of the signal CEn, remains at "0" even after the signal CEn has been brought to "1".

The change of the WAIT signal to "1" brings about resetting of the flip-flop 13 ("sync_set FF") and hence the switching of the signal Sync_res to "1". This causes the signal Sync_ok to change to "0" and hence the signal del_CEn to change to "1". This event causes the output of the NAND gate A1 to change to "0", that is, the signal sh_CEn to change to "1", and the signal SA_dis to change to "1". This latter signal brings about disablement of the reading circuits of the two memory banks.

The circuits of the block 12 thus prevent a reading cycle in progress from being interrupted abruptly at the moment at which the microprocessor brings about disablement of the memory by means of the signal CE. The conditions for the correctness of the last reading and simultaneously for the completion of the recovery operations are thus achieved.

The timing and control structure described permits identification of the type of reading cycle to be performed by the memory (random-access reading cycle with address supplied to the memory from the exterior, or sequential "burst" reading cycle, in which the memory accesses an origin location the address of which is supplied to the memory from the exterior and subsequently accesses, in sequence, the memory locations succeeding the origin location and belonging alternately to one or to the other of the two memory banks in accordance with an interleaved method). According to the type of reading cycle, the timing and control structure arranges paths for the synchronization of the circuit block of the memory involved in the execution of a reading operation.

The timing and control structure introduces suitable delays which are necessary to allow the memory to perform some functions, for example, the "recovery" function, when the memory is put in standby.

Clearly variations and/or additions may be provided for the embodiment described and illustrated.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

What is claimed is:

1. A timing and control structure for a memory that has a pair of memory banks each of which is associated with respective circuits for selecting the memory locations of the bank and respective circuits for reading the contents of the locations selected, and an internal addressing structure for executing random-access readings by accessing locations corresponding to addresses supplied to the memory from the exterior, and sequential readings by accessing, in sequence, starting from an origin memory location the address of which is supplied to the memory from the exterior, memory locations succeeding the origin location and belonging to one and to the other of the memory banks, the timing and control structure comprising:

first circuit means for recognizing, on the basis of control signals supplied to the memory from the exterior, whether a random-access reading is to be executed, the control signals comprising a first control signal indicative of the presence of an address supplied to the memory from the exterior, and a second control signal which, upon switching edges of a first type, supplies to the control and timing structure a time base for the execution of the random-access readings and, upon switching edges of a second type, supplies a time base for the execution of the sequential readings;

second circuit means that are controlled by the first circuit means and which, for a random-access reading, generate a first synchronism signal in response to a transition of the first type in the second control signal;

third circuit means that are sensitive to transitions of the second type in the second control signal and which can generate a second synchronism signal upon transitions of the second type; and fourth circuit means that are controlled by the first circuit means and which supply a stimulus signal to a timing circuit of the memory, the stimulus signal corresponding to the first synchronism signal for a random-access reading, or to the second synchronism signal for a sequential reading.

2. The timing and control structure of claim 1 that, when the first control signal is kept continuously at a predetermined logic level, particularly a high logic level, is configured to initiate the execution solely of random-access readings.

3. The timing and control structure of claim 2 that, when the first control signal is set at the predetermined logic level, particularly the high logic level, is configured to cause data resulting from a reading to be made available outside the memory solely when the second control signal adopts a low logic level.

4. The timing and control structure of claim 3 wherein the second circuit means comprise a first set/reset flip-flop that is reset at the start of a random-access reading and is set in response to the transition of the first type in the second control signal, the setting of the first flip-flop triggering the generation of the first synchronism signal.

5. The timing and control structure of claim 4 wherein the first flip-flop is set in response to the transition of the first type in the second control signal, upon the condition that, in the random-access reading in progress, the evaluation of the datum contained in the memory location addressed by the address supplied to the memory from the exterior has started.

6. The timing and control structure of claim 5 wherein the evaluation of the data in the two memory banks are carried out mutually exclusively.

7. The timing and control structure of claim 6 wherein the second circuit means comprise a delay line downstream of the first flip-flop configured so that the first synchronism signal is generated with a suitable delay relative to the moment at which the first flip-flop is set.

8. The timing and control structure of claim 7 wherein the second circuit means comprise means for regulating the delay introduced by the delay line.

9. The timing and control structure of claim 8 wherein the fourth circuit means comprise a switch for switching the stimulus signal to the first synchronism signal or to the second synchronism signal, and a circuit for controlling the switch.

10. The timing and control structure of claim 9 wherein the circuit for controlling the switch comprises a second set/reset flip-flop which is reset when the first circuit means detect a request for the execution of a random-access reading, the resetting of the second flip-flop bringing about the switching the stimulus signal to the first synchronism signal.

11. The timing and control structure of claim 10 wherein the second flip-flop is set in response to a transition of the first type of the second control signal, upon the condition that the random-access reading in progress has reached completion, the setting of the second flip-flop bringing about the switching of the stimulus signal to the second synchronism signal.

12. The timing and control structure of claim 11 wherein the second flip-flop is set by the activation of a power-on resetting signal that is activated by the switching-on of the memory.

13. The timing and control structure of claim 12 wherein the third circuit means comprise a first circuit that is sensitive to transitions of the second type in the second control signal, and a second circuit that is sensitive to a third control signal external to the memory and that brings about the enablement/disablement thereof, and a second switch that can switch the second synchronism signal to the output of the first circuit or of the second circuit.

14. The timing and control structure of claim 13 wherein the second switch is controlled by an internal disablement signal and configured so that when the memory is disabled the switch is switched to the output of the second circuit so that the stimulus signal is produced upon enablement of the memory.

15. The timing and control structure of claim 14, further comprising fifth circuit means for causing the memory to execute operations to complete a reading in progress and to recover the datum read, upon a command for disablement of the memory by means of the third control signal.

16. The timing and control structure of claim 15 wherein the fifth circuit means is configured to detect an external command for putting the memory in standby and can generate an internal command to put the memory in standby only upon completion of a reading operation in progress.

17. The timing and control structure of claim 16 wherein the fifth circuit means comprise a circuit for generating a signal for deactivating the reading circuits associated with the two memory banks, the deactivation signal activated in response to the external command to put the memory in standby only after the reading in progress has been completed.

18. The timing and control structure of claim 17 wherein the circuit for generating the signal for deactivating the reading circuits comprises a third set/reset flip-flop that is set by a signal indicative of the completion of a reading in progress, the setting of the third flip-flop, in combination with the presence of the external command to put the memory in standby, configured to activate the signal for deactivating the reading circuits.

19. The timing and control structure of claim 18 wherein the signal indicative of the completion of a reading in progress is a signal that is activated upon completion of each reading of a memory location with random or sequential access, in order to suspend activities to update the internal addressing structure of the memory whilst awaiting the occurrence of a transition of the second type in the first control signal.

20. The timing and control structure of claim 19 wherein, when the memory is put in standby whilst the signal indicative of the completion of a reading in progress is active, upon leaving the standby condition, the memory is configured to output the datum resulting from the last reading performed.

21. The timing and control structure of claim 20 wherein the third flip-flop produces a signal that, when the third flip-flop is set, isolates the reading circuits associated with the two memory banks from output buffer circuits of the memory.

22. The timing and control structure of claim 21 wherein, when the signal indicative of the completion of a reading is active, the reading circuits associated with the two memory banks are isolated from the output buffer circuits of the memory.

23. The timing and control structure of claim 22 wherein the third flip-flop is also set at the start of a random-access reading.

24. A semiconductor memory comprising a pair of memory banks each of which is associated with respective circuits for selecting memory locations of the bank and respective circuits for reading the contents of the locations selected, and an internal addressing structure for executing random-access readings by accessing locations corresponding to addresses supplied to the memory from the exterior, and sequential readings by accessing, in sequence, starting from an origin memory location the address of which is supplied to the memory from the exterior, memory locations succeeding the origin location and belonging to one and to the other of the memory banks, alternately, and a timing and control structure comprising:

a first circuit configured to receive first and second external control signals, the first control signal supplying an indication of the presence of an address supplied to the memory, and the second control signal supplying a time base for the execution of random-access readings upon switching edges of a first type, and upon switching edges of a second type supplying a time base for the execution of sequential readings of the memory;

a second circuit controlled by the first circuit and configured to generate a first synchronization signal for a random-access reading in response to a transition of the first type in the second control signal;

a third circuit configured to respond to transitions of the second type in the second control signal and to generate a second synchronization signal upon transitions of the second type; and a fourth circuit controlled by the first circuit to supply a stimulus signal to a timing circuit of the memory, the stimulus signal corresponding to the first synchronization signal generated by the second circuit for a random access reading or to the second synchronization signal generated by the third circuit for a sequential reading.

25. A timing and control structure for a memory having first and second memory banks and configured to read the first and second memory banks by random access readings in response to external addresses, and to read the first and second memory banks in sequential readings by accessing, in sequence, memory locations supplied to the memory from external addresses beginning from an original memory location and succeeding sequentially to one and then to the other of the first and second memory banks alternatingly, the timing and control structure comprising:

a first circuit configured to receive first and second external control signals, the first control signal supplying an indication of the presence of an address supplied to the memory, and the second control signal supplying a time base for the execution of random-access readings upon switching edges of a first type, and upon switching edges of a second type supplying a time base for the execution of sequential readings of the memory;

a second circuit controlled by the first circuit and configured to generate a first synchronization signal for a random-access reading in response to a transition of the first type in the second control signal;

a third circuit configured to respond to transitions of the second type in the second control signal and to generate a second synchronization signal upon transitions of the second type; and a fourth circuit controlled by the first circuit to supply a stimulus signal to a timing circuit of the memory, the stimulus signal corresponding to the first synchronization signal generated by the second circuit for a random access reading or to the second synchronization signal generated by the third circuit for a sequential reading.

26. A timing and control structure for a memory having first and second memory banks and configured to read the first and second memory banks by random access readings in response to external addresses, and to read the first and second memory banks in sequential readings by accessing, in sequence, memory locations supplied to the memory from external addresses beginning from an original memory location and succeeding sequentially to one and then to the other of the first and second memory banks alternatingly, the timing and control structure comprising:

a first circuit configured to receive first and second external control signals, the first control signal supplying an indication of the presence of an address supplied to the memory, and the second control signal supplying a time base for the execution of random-access readings upon switching edges of a first type, and upon switching edges of a second type supplying a time base for the execution of sequential readings of the memory;

a second circuit controlled by the first circuit and configured to generate a first synchronization signal for a random-access reading in response to a transition of the first type in the second control signal, the second circuit comprising a first set/reset flip-flop that is reset at the start of a random-access reading and is set in response to a transition of the first type in the second control signal, the setting of the first flip-flop triggering the generation of the first synchronization signal;

a third circuit configured to respond to transitions of the second type in the second control signal and to generate a second synchronization signal upon transitions of the second type; and a fourth circuit controlled by the first circuit to supply a stimulus signal to a timing circuit of the memory, the stimulus signal corresponding to the first synchronization signal generated by the second circuit for a random access reading or to the second synchronization signal generated by the third circuit for a sequential reading.

27. A timing and control structure for a memory having first and second memory banks and configured to read the first and second memory banks by random access readings in response to external addresses, and to read the first and second memory banks in sequential readings by accessing, in sequence, memory locations supplied to the memory from external addresses beginning from an original memory location and succeeding sequentially to one and then to the other of the first and second memory banks alternatingly, the timing and control structure comprising:

a first circuit configured to receive first and second external control signals, the first control signal supplying an indication of the presence of an address supplied to the memory, and the second control signal supplying a time base for the execution of random-access readings upon switching edges of a first type, and upon switching edges of a second type supplying a time base for the execution of sequential readings of the memory;

a second circuit controlled by the first circuit and configured to generate a first synchronization signal for a random-access reading in response to a transition of the first type in the second control signal;

a third circuit configured to respond to transitions of the second type in the second control signal and to generate a second synchronization signal upon transitions of the second type; and a fourth circuit controlled by the first circuit to supply a stimulus signal to a timing circuit of the memory, the stimulus signal corresponding to the first synchronization signal generated by the second circuit for a random access reading or to the second synchronization signal generated by the third circuit for a sequential reading, the fourth circuit comprising a switch for switching the stimulus signal between the first synchronization signal and to the second synchronization signal, and a circuit for controlling the switch that comprises a set/reset flip-flop that is reset when the first circuit detects a request for the execution of a random-access reading, the resetting of the flip-flop bringing about the switching of the stimulus signal to the first synchronization signal, and the flip-flop configured to respond to a transition of the first type of the second control signal, and upon the condition that the random-access reading in progress has reached completion, the setting of the flip-flop configured to switch the stimulus signal to the second synchronization signal.

* * * * *